United States Patent [19]
Leow et al.

[11] 4,375,635
[45] Mar. 1, 1983

[54] SIGNAL MEASUREMENT APPARATUS

[75] Inventors: Chon H. Leow, Portland, Oreg.; Toshihisa Nagai, Tokyo, Japan

[73] Assignee: Tektronix, Inc., Beaverton, Oreg.

[21] Appl. No.: 148,643

[22] Filed: May 12, 1980

[30] Foreign Application Priority Data
May 23, 1979 [JP] Japan .................................. 54/63746

[51] Int. Cl.³ .......................... G06F 11/00; H03K 5/19
[52] U.S. Cl. ................................ 340/146.3 Q; 371/25
[58] Field of Search ................ 340/146.3 Q, 146.3 M, 340/146.3 A, 146.2; 371/24, 25, 16, 71; 324/73 R, 73 AT, 73 PC

[56] References Cited
U.S. PATENT DOCUMENTS

| | | | |
|---|---|---|---|
| 3,821,645 | 6/1974 | Vinsani | 371/25 |
| 3,930,231 | 12/1975 | Henrichon, Jr. et al. | 340/146.3 MA |
| 4,108,359 | 8/1978 | Proto | 371/25 |
| 4,110,737 | 8/1978 | Fahey | 340/146.3 Q |
| 4,176,780 | 12/1979 | Sacher et al. | 371/25 |
| 4,257,031 | 3/1981 | Kirner et al. | 371/24 |

Primary Examiner—Leo H. Boudreau
Attorney, Agent, or Firm—George T. Noe

[57] ABSTRACT

A word recognizer probe to be removably incorporated with the mainframe of a logic analyzer is disclosed. The use of serial input-parallel output type memory means in the probe minimizes the number of interconnection signal paths between the probe and the mainframe regardless of the input bits to be recognized.

15 Claims, 4 Drawing Figures

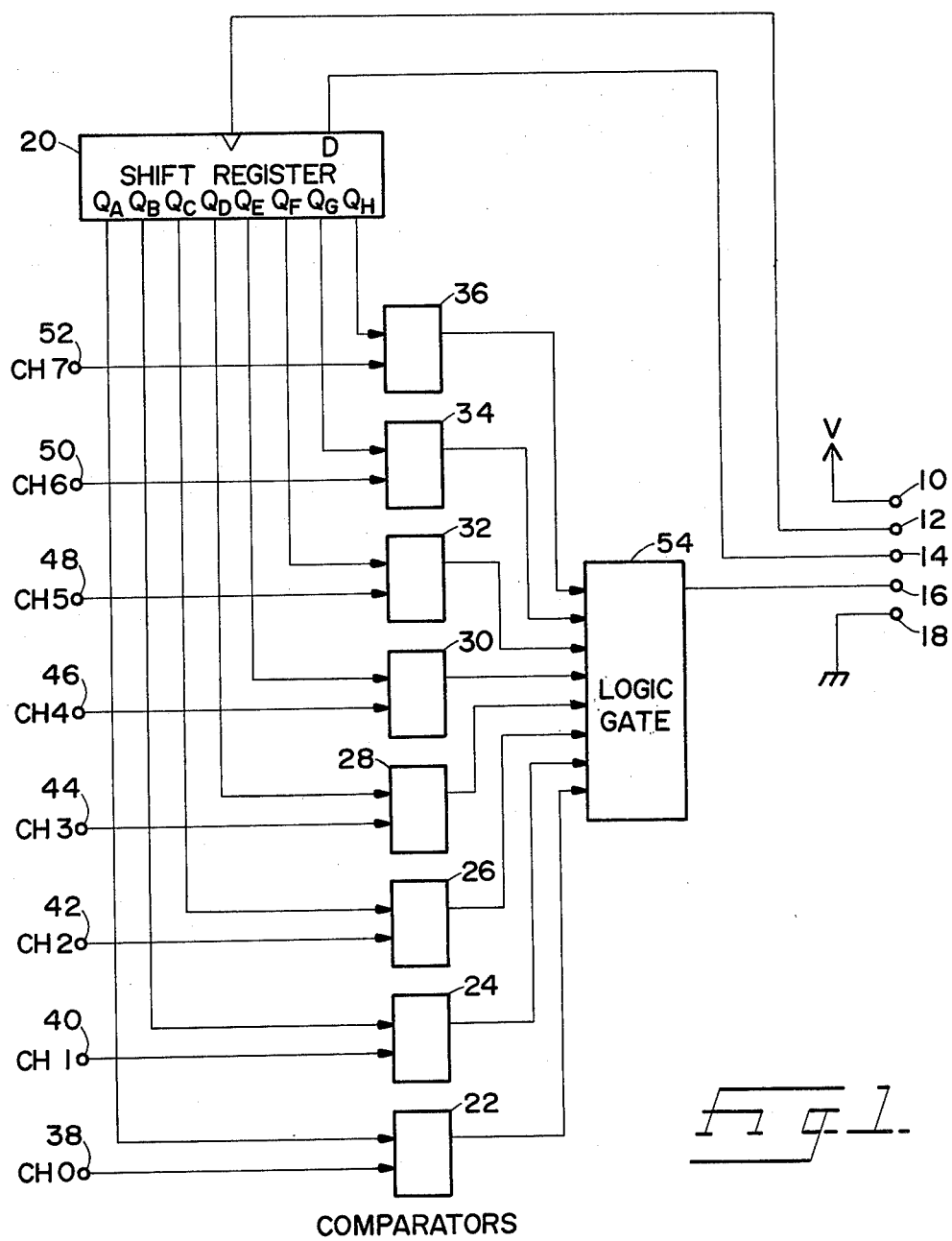

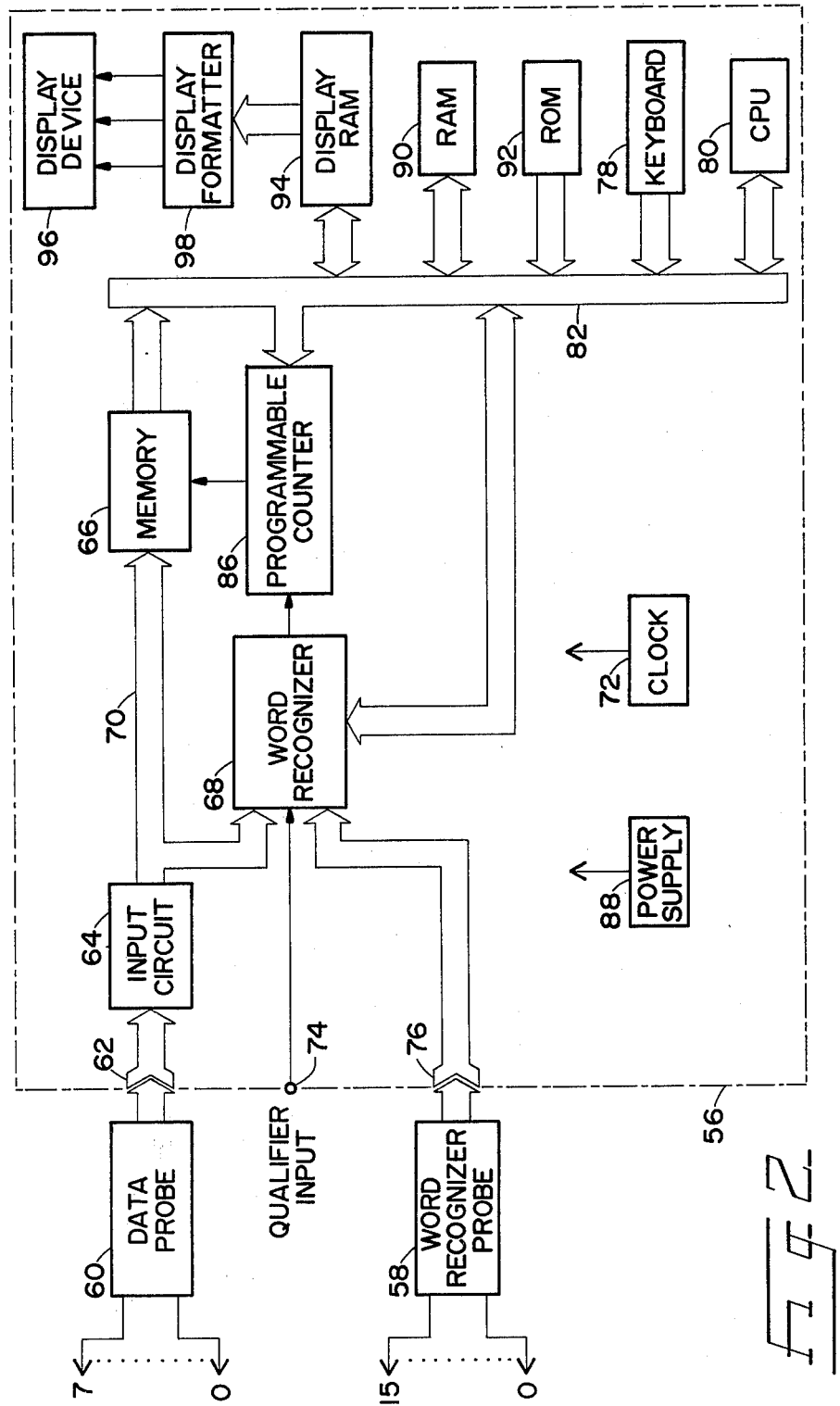

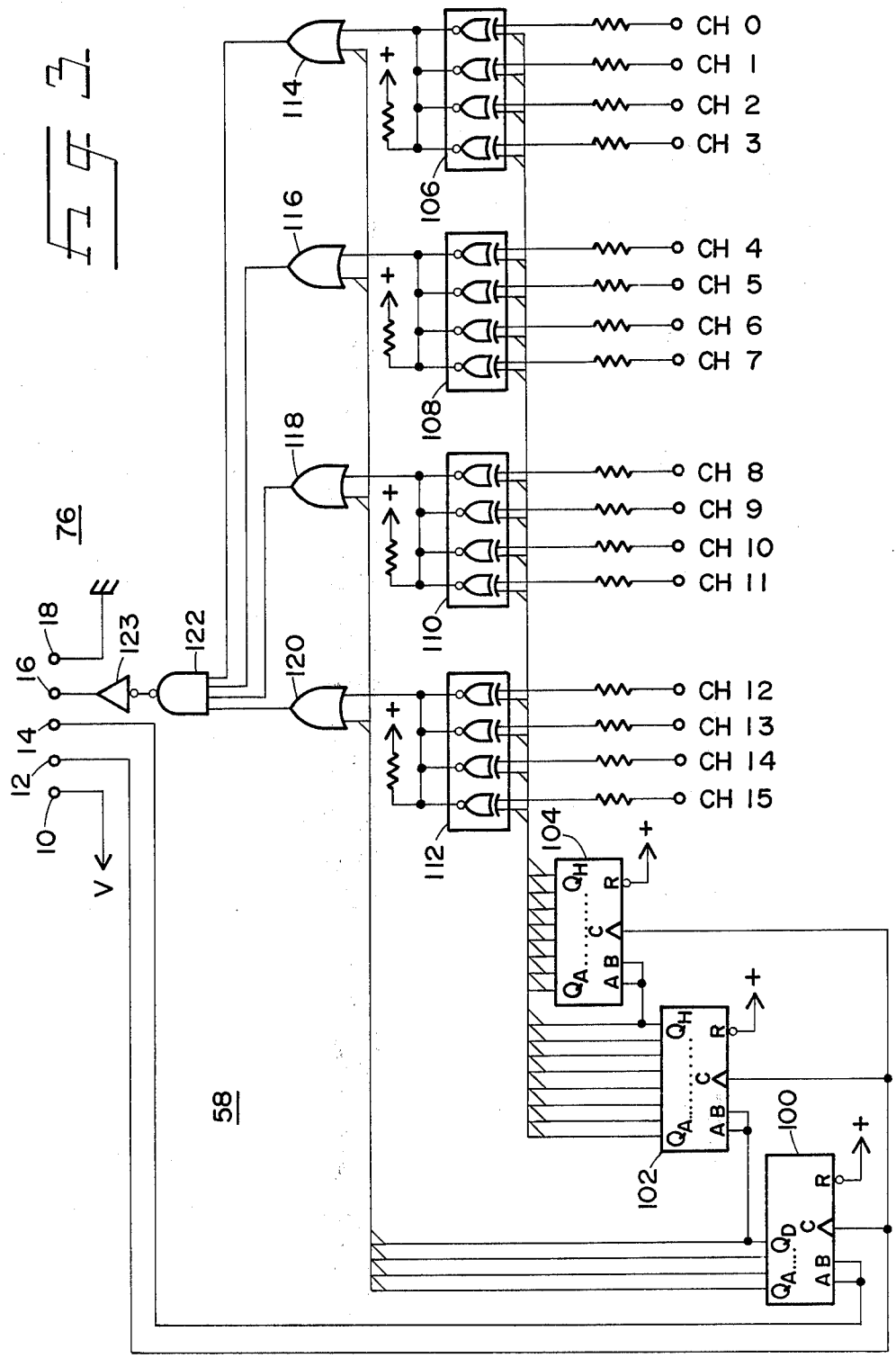

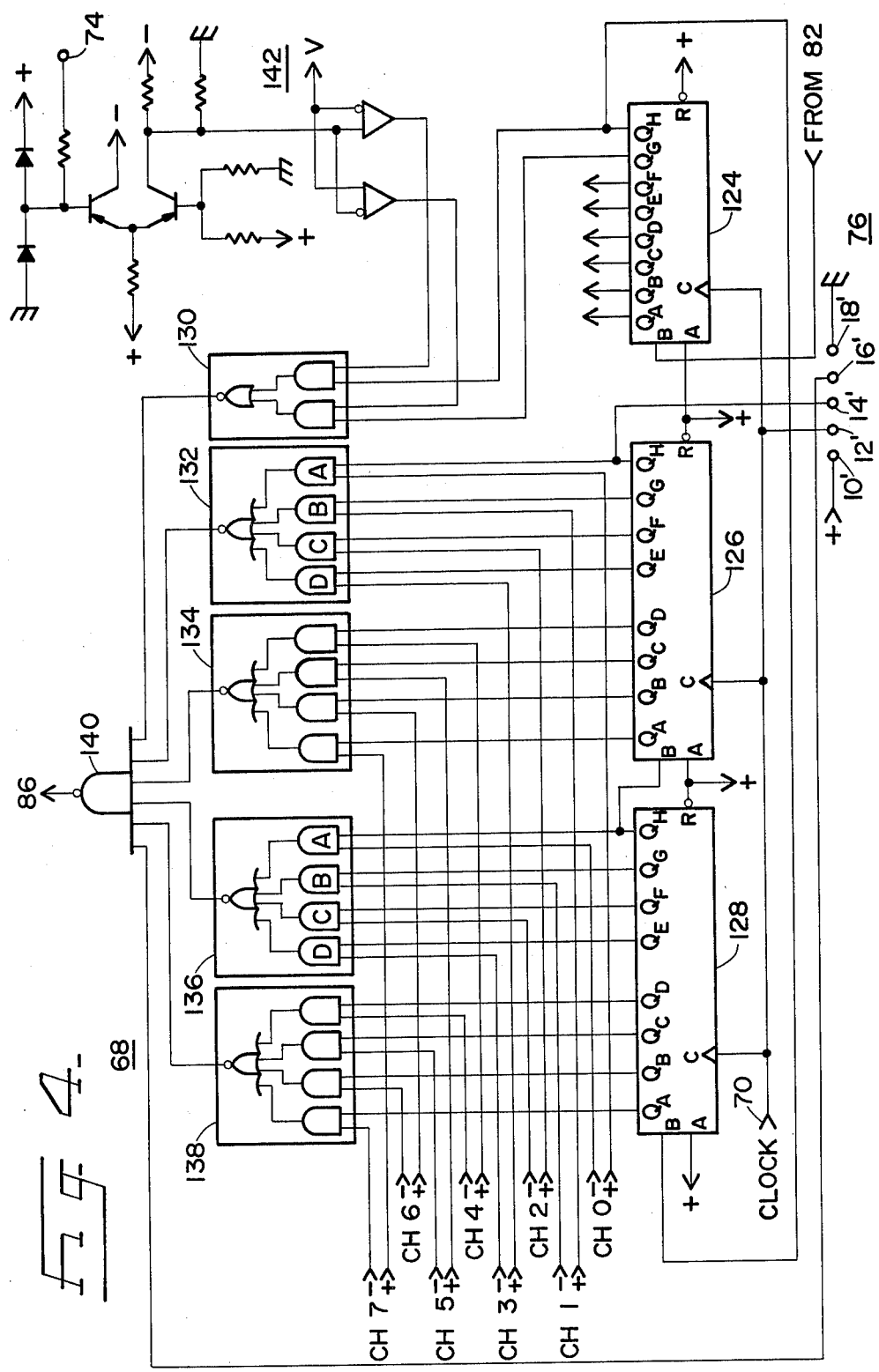

SIGNAL MEASUREMENT APPARATUS

BACKGROUND OF THE INVENTION

The present invention relates to a signal measurement apparatus being able to detect a desired logic combination of logic input signals.

Recently, logic technique is gaining popularity in the measurement field of digital analog signals. Logic signal measurement apparatus such as logic analyzers are suitable for adjustment and troubleshooting of the digital instruments such as, for example, computers, electronic calculators, computer terminals and digital control systems. Such logic analyzers are frequently required to measure logic level (High or Low) and timing relationship of a plurality of logic signals on a data bus, an address bus or various circuit points, because the logic analyzers can measure the plurality of logic signals prior to a trigger signal and can generate the trigger signal when the combination of the logic signals matches with a desired logic pattern. This trigger mode is called "combination trigger" or "word trigger", and the circuit for this trigger mode is called "word recognizer".

A conventional word recognizer circuit is included in a signal measurement apparatus such as the logic analyzer, and consists of a plurality of logic gates and switches for setting the desired logic pattern. Each of the logic gates receives a logic signal to be measured and the desired logic level from the switch for comparing them. The outputs from the plurality of logic gates are applied to an AND (or NAND) gate so that it generates a trigger pulse when the combination of the input logic signals corresponds to the desired logic pattern set by the switches.

An operator may want to obtain the combination trigger of the logic signals in excess of the number of the input terminals of the signal measurement apparatus. For example, it may be desired to measure logic signals on the data bus; however, the logic signals on both the data bus and the address bus are to be applied to the word recognizer. In the conventional signal measurement apparatus, however, a qualifier or auxiliary input is required to provide a number of input terminals of the word recognizer equal to the number of input terminals of the signal measurement apparatus. Thus, the conventional signal measurement apparatus cannot be readily utilized in situations in which signals outnumber input terminals. For realizing this purpose, additional logic gates, switches and input terminals for the word recognizer may be provided in the signal measurement apparatus. This results in increased use of panel space, increased instrument size, and an unnecessary expense for users who do not desire the additional inputs of the word recognizer.

It is, therefore, an object of the present invention to provide an improved signal measurement apparatus which can detect a desired logic combination of more logic signals than the number of input terminals of the apparatus without increasing the space of the apparatus.

It is another object of the present invention to provide a compact signal measurement apparatus including a word recognizer which can increase the number of logic signals for the combination trigger without increasing the space of the signal measurement apparatus.

It is an additional object of the present invention to provide an improved signal measurement apparatus consisting of a main-frame and a sub-frame for increasing the number of logic signals for the combination trigger.

Other objects and attainments of the present invention will become apparent to those skilled in the art upon a reading of the following detailed description when taken in conjunction with the drawings.

DRAWINGS

FIG. 1 is a block diagram of a word recognizer probe for a logic analyzer in accordance with the present invention;

FIG. 2 is a block diagram of a logic analyzer in accordance with the present invention;

FIG. 3 is a detailed schematic diagram of a word recognizer probe circuit; and

FIG. 4 is a detailed schematic diagram of a word recognizer circuit portion of a logic analyzer.

DETAILED DESCRIPTION OF THE INVENTION

FIG. 1 is a block diagram of a word recognizer probe sub-frame according to the present invention. The sub-frame includes five input connectors 10 through 18 for connecting the main-frame of the measurement instrument such as a logic analyzer. Connector 10 receives a voltage from the main-frame for active devices of the sub-frame, and connector 18 is provided for the ground. Serial input-parallel output type logic memory 20 such as a shift register receives a clock signal and a serial logic data at a clock input and a data input through connectors 12 and 14 from the main-frame. The serial logic data is synchronized with the clock signal and consists of 8 bits for setting a desired logic combination. This 8 bits serial data is converted to 8 bit parallel data by shift register 20. First comparison means 22 compares a first bit logic level at output terminal QA of shift register 20 with a zero channel logic signal from channel 0 input terminal 38, and generates an output signal when the logic levels thereof are equal to each other. Second comparison means 24 generate an output signal when a logic level at channel 1 input terminal 40 is equal to a second bit logic level at output terminal $Q_B$ of shift register 20. Similarly, comparison means 26 through 36 compare logic levels at terminals 42 through 52 with logic levels at terminals $Q_C$ through $Q_H$ of shift register 20, respectively, and each of comparison means 26 through 36 generates an output signal when both of the logic levels are equal. The outputs from comparison means 26 through 36 are applied to logic gate 54 as an AND gate which generates a trigger signal when all of the outputs occur at the same time. The trigger signal is applied to the main-frame through connector 16. It should be noted that the logic combination of eight logic signals is obtained with five connectors of the main-frame. Since the desired logic pattern is determined by the serial data which is applied from a simple switch such as a key switch, a large space is not required for the switch.

FIG. 2 illustrates a block diagram of the present invention consisting of main-frame 56 such as the logic analyzer, 16 channels sub-frame 58 called "word recognizer probe", and data probe 60. Data probe 60 is an eight-channels active or passive probe and the outputs therefrom are applied through connector 62 to input circuit 64. Input circuit 64 consists of comparators for deciding the input logic levels from data probe 60 and for converting them to predetermined analog levels such as TTL, ECL or the like used in main-frame 56. The outputs from input circuit 64 are applied to high speed memory 66 and word recognizer 68 via data line 70. The input data is stored in memory 66 in synchronism with a high frequency clock from clock generator 72. Additional logic signals are applied from word recognizer probe 58 and qualifier terminal 74 to word recognizer 68, if necessary. Word recognizer probe 58 and word recognizer 68 will be described in detail hereinafter by reference to FIGS. 3 and 4; however, it should be noted that connector 76 provided between probe 58 and block 68 consists of five terminals regardless of the number of input signals applied to probe 58.

The desired logic pattern for the combination trigger is set by keyboard 78, and the signal therefrom is applied through central processing unit and chip select (CPU) 80 and bus 82 to word recognizer 68. Programmable counter 86 receives a trigger signal from word recognizer 68, program information from keyboard 78 through CPU 80 and bus 82, and the clock signal from clock generator 72. Since main-frame 56 includes programmable counter 86, this signal measurement apparatus can measure the input data prior to the trigger signal. When counter 86 counts a desired number of the clock signal after the trigger signal, counter 86 applies a control signal to high speed memory 66 for storing a desired portion of the input data in memory 66. The data stored in memory 66 is transferred into CPU random access memory (RAM) 90 via bus 82. CPU 80 processes the input data stored in CPU RAM 90 in accordance with command information stored in read only memory (ROM) 92 for comparing a new data with an old data, searching a desired word, magnifying a displayed data, etc. The processed data is transferred to display RAM 94 and is displayed on raster scanning display device 96 by video display formatter 98. The output from clock generator 72 and power supply circuit 88 are applied to each block of main-frame 56.

Refer to FIGS. 3 and 4 respectively illustrating a circuit schematic of sub-frame or word recognizer probe 58 and word recognizer 68, connector 76 consist of terminals 10 through 18 of sub-frame 58 and terminals 10' through 18' of main-frame 56 receiving terminals 10 through 18. Word recognizer probe 58 is constructed by 8 bit serial-parallel shift registers 100 through 104 as serial input-parallel output type logic memory means, exclusive NOR gates 106 through 112, OR gates 114 through 120, and AND gate 122. Devices 106 through 122 operate as comparison means. Word recognizer 68 includes 8 bit serial-parallel shift registers 124 through 128, logic gates 130 through 138 consisting of AND and NOR gates, NAND gate 140, and qualifier input circuit 142. Shift registers 100 through 104 and 124 through 128 may be 74LS164 of Texas Instruments, exclusive NOR gates 106 through 112 may be 74LS266, OR gates 114 through 120 may be 74S32, NAND gates 122 and 140 may be 74S140 and 74S30, logic gate 130 may be 74S51, and logic gates 132 through 138 may be 74S64.

The active devices of sub-frame 58 receive the power voltage from power supply circuit 88 through terminals 10'-10, and shift registers 100 through 104 of sub-frame 58 receive the clock signal from clock generator 72 through terminals 12'-12. The serial logic signal for setting the desired logic pattern is applied from bus 82 to data input terminal B of shift register 124 in synchronism with the clock signal. The serial logic signal is shifted step by step in shift register 124, and output $Q_H$ thereof is applied to data input terminal B of shift register 128. Similarly, output $Q_H$ of shift register 128 is applied to data input B of shift register 126 output $Q_H$ of which is applied to data inputs A-B of shift register 100 via data terminals 14' and 14. Outputs $Q_D$ and $Q_H$ of shift registers 100 and 102 are connected to inputs A-B of shift registers 102 and 104, respectively. Thus, the first through fourth logic levels of the serial logic signal are applied from outputs $Q_H$ through $Q_E$ of shift register 104 to exclusive NOR gates 106 which receive channel 0 through 3 input logic signals. Gates 106 generates an output signal when the input logic signals of channels 0 through 3 respectively correspond to the first through fourth logic levels of the serial logic signal, because each of the outputs of exclusive NOR gates 106 is connected in common as a wired AND gate. Exclusive NOR gates 108 respectively compare input logic signals of channels 4 through 7 with the fifth through eighth logic levels of the serial logic signal from outputs $Q_D$ through $Q_A$ of shift register 104. Similarly, exclusive NOR gates 110–112 receive the ninth through sixteenth logic levels of the serial logic signal from shift register 102 and input logic signals of channels 8 through 15 for comparing them.

The word recognizer according to the present invention has the "don't care" mode, which eliminates a desired channel logic input from the combination trigger. The seventeenth through twentieth logic levels of the serial logic signal at outputs $Q_D$ through $Q_A$ of shift register 100 are respectively "don't care" information for channel 0-3, channel 4-7, channel 8-11, and channel 12-15, because OR gates 114 through 120 receive the outputs from exclusive NOR gates 106 through 112 and shift register 100. For example, when the seventeenth logic level at output $Q_D$ of shift register 100 is "high", the logic input of channel 0-3 are eliminated from the combination trigger. Since NAND gate 122 receives the outputs from OR gates 114 through 120, gate 122 generates "Low" level when the combination of the logic signals of channel 0-15 is equal to the desired logic pattern determined by the first through twentieth logic levels of the serial logic signal from bus 82. This "Low" level is inverted by inverter 123, and the "High" level therefrom is the trigger signal generated by word recognizer probe 58 and is applied to NAND gate 140 via trigger terminals 16–16'.

The twenty-first and twenty-ninth logic levels of the serial logic signal at outputs $Q_H$ of shift registers 126 and 128 are for setting the desired logic level of channel 0 of data probe 60. In this embodiment, word recognizer 68 receives push-pull signals from input circuit 64. Two AND gates A of logic gates 132 and 136 receive outputs $Q_H$ of shift register 126 and 128 and channel 0 push-pull logic signal of data probe 60. If the desired level of channel 0 is set "High", outputs $Q_H$ of shift register 126 and 128 are respectively "Low" and "High". AND gates A of logic gates 132 and 136 generate "Low", when channel 0 signal is "High" or the desired logic level. Similarly, AND gates B of logic gates 132 and 136 compare channel 1 signal with the twenty-second and thirtieth logic levels of the serial logic signal from output $Q_G$ of shift register 126 and 128. Thus, when the combination of channel 0 through 3 logic signals is equal to the desired logic pattern, logic gates 132 and 136 generate "High" level. Similarly, when the combination of channel 4 through 7 logic signals is equal to the desired logic pattern, logic gates 134 and 138 generate "High" level.

Since the push-pull signals of the input data and the set data are used, "don't care" mode can be applied to each of channels of data probe 60. For this purpose, logic "Low" is applied to two AND gates for the desired channel.

The thirty-seventh and thirty-eighth levels of the serial logic signal at outputs $Q_H$ and $Q_G$ of shift register 124 are applied to logic gates 130 for the qualifier input from circuit 142. Therefore, when the combination of input logic levels applied to word recognizer probe 58, data probe 60 and terminal 74 is equal to the desired logic pattern set by keyboard 78, NAND gate 140 generates "Low" level which is applied to counter 86. It should be noted that word recognizer probe 58 can be removed from main-frame 56 if it is not necessary. An opened terminal operates to supply "High" level to NAND gate 140.

As understood from the foregoing description, the signal measurement apparatus of the present invention can detect the desired logic combination of more logic signals than the channel number of the data probe without increasing the space of the apparatus, so that the apparatus can be compact. In addition, the sub-frame or word recognizer probe is connected to the main-frame by only five terminals regardless of the channel number of the sub-frame. Since the data entry for the combination trigger can be done by only three keys or switches of "High" "Low" and "don't care", and these keys are used for the signals from both the data probe and the word recognizer probe, additional key space is not necessary. The desired logic pattern set by the keys may be displayed on raster display 96 for confirming the set pattern.

Although the above description is made on only one preferred embodiment of this invention, it will be apparent to those skilled in the art that various modification can be made without departing from the scope and spirit of the present invention.

What we claim as being novel is:

1. A signal measurement apparatus for measuring an input signal in response to a selected logic combination of n-channel parallel logic input signals, comprising:
    a mainframe for receiving said input signal to be measured, said mainframe including a clock generator for generating a clock signal and means for generating a single serial logic signal consisting of n bits in synchronism with said clock signal to set said logic combination; and
    a subframe including serial input-parallel output type logic memory means and comparison means; said memory means receiving said clock signal and said serial logic signal from said mainframe for converting said serial logic signal into an n-bit parallel logic signal; said comparison means comparing said n-bit parallel logic signal from said memory means with said n-channel parallel logic input signals and generating an output signal when a combination of said n-channel parallel logic input signals corresponds to said logic combination set by said mainframe;
    wherein said output signal from said comparison means is supplied to said mainframe for controlling the operation of said mainframe.

2. A signal measurement apparatus according to claim 1, wherein said mainframe is a logic analyzer for measuring logic input signal(s).

3. A signal measurement apparatus according to claim 1, wherein said subframe is a word recognizer controlled by said mainframe and supplying a detected output signal to said mainframe.

4. A signal measurement apparatus according to claim 3, wherein said mainframe further includes a second word recognizer for generating an output signal when said logic input signals applied to said mainframe correspond to a preselected logic combination.

5. A signal measurement apparatus according to claim 4, wherein said mainframe further including logic means generating an output when both of said word recognizers generate said output signals.

6. A signal measurement apparatus according to claim 1, wherein said serial input-parallel output type logic memory is a shift register.

7. A signal measurement apparatus according to claim 1, wherein said comparison means consists of logic gates.

8. A signal measurement apparatus according to claim 1, wherein said means for generating said serial logic signal consists of a keyboard and a processor.

9. A signal measurement apparatus according to claim 1, wherein said subframe further includes "don't care" means connected to said comparison means for selectively eliminating one or more of said n-channel logic input signals from comparison with said logic combination.

10. A logic analyzer for measuring one or more logic input signals in response to a selected logic combination of n-channel parallel logic input signals, comprising:
    a mainframe for receiving said logic input signals to be measured, said mainframe including a clock generator for generating a clock signal and setting means for generating a single serial logic signal consisting of n bits in synchronism with said clock signal to set said logic combination;
    a word recognizer including serial input-parallel output type logic memory for converting said serial logic signal into an n-bit parallel logic signal and comparison means for generating an output when a combination of said n-channel parallel logic input signals corresponds to a combination of said parallel logic signal from said memory means; and
    interconnection means for connecting said word recognizer to said mainframe; said interconnection means including conductors for supplying power voltage, reference level, said serial logic signal, said clock signal, and said output signal.

11. A logic analyzer according to claim 10, wherein said serial input-parallel output type logic memory is a shift register, and said comparison means consists of logic gates.

12. A logic analyzer according to claim 10, wherein said mainframe includes a keyboard and a processor.

13. A logic analyzer according to claim 10, wherein said word recognizer further includes "don't care" means connected to said comparison means for selectively eliminating one or more of said n-channel logic input signals from comparison with said logic combination.

14. A logic analyzer according to claim 10, wherein said mainframe further includes a second word recognizer for generating an output signal when said logic input signals applied to said mainframe correspond to the preselected logic combination.

15. A logic analyzer according to claim 14, wherein said mainframe further includes logic means for generating an output when both of said word recognizers generate said output signals.

* * * * *